(12) United States Patent
Aburaya et al.

(10) Patent No.: US 8,324,625 B2
(45) Date of Patent: Dec. 4, 2012

(54) ELECTRONIC DEVICE AND METHOD FOR PRODUCING THE SAME

(75) Inventors: Yoshihiro Aburaya, Kanagawa (JP); Hiroyuki Yaegashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 205 days.

(21) Appl. No.: 12/825,315

(22) Filed: Jun. 28, 2010

(65) Prior Publication Data
US 2011/0006298 A1  Jan. 13, 2011

(30) Foreign Application Priority Data
Jul. 9, 2009  (JP) .................. 2009-162625

(51) Int. Cl.
H01L 29/04 (2006.01)
H01L 29/10 (2006.01)
H01L 31/00 (2006.01)
(52) U.S. Cl. .......................... 257/59; 257/770
(58) Field of Classification Search .............. 257/59, 257/770
See application file for complete search history.

(56) References Cited

U.S. PATENT DOCUMENTS

| | | | | |
|---|---|---|---|---|
| 2002/0039000 | A1* | 4/2002 | Shirakawa et al. | 313/506 |
| 2002/0096737 | A1* | 7/2002 | Nakamura et al. | 257/532 |
| 2004/0201018 | A1* | 10/2004 | Yamahara et al. | 257/59 |
| 2007/0007522 | A1* | 1/2007 | Tsao et al. | 257/57 |

FOREIGN PATENT DOCUMENTS

| | | |
|---|---|---|
| JP | 2007-250982 A | 9/2007 |
| JP | 2008-219008 A | 9/2008 |

* cited by examiner

*Primary Examiner* — Jarrett Stark
*Assistant Examiner* — John M Parker
(74) *Attorney, Agent, or Firm* — SOLARIS Intellectual Property Group, PLLC

(57) ABSTRACT

An electronic device including a first electrode that is provided on a substrate and includes an Mo—Nb alloy, an insulating film disposed on the first electrode, and a second electrode disposed on the first electrode with at least the insulating film interposed between the first electrode and the second electrode; and a method for producing the electronic device are provided.

10 Claims, 7 Drawing Sheets

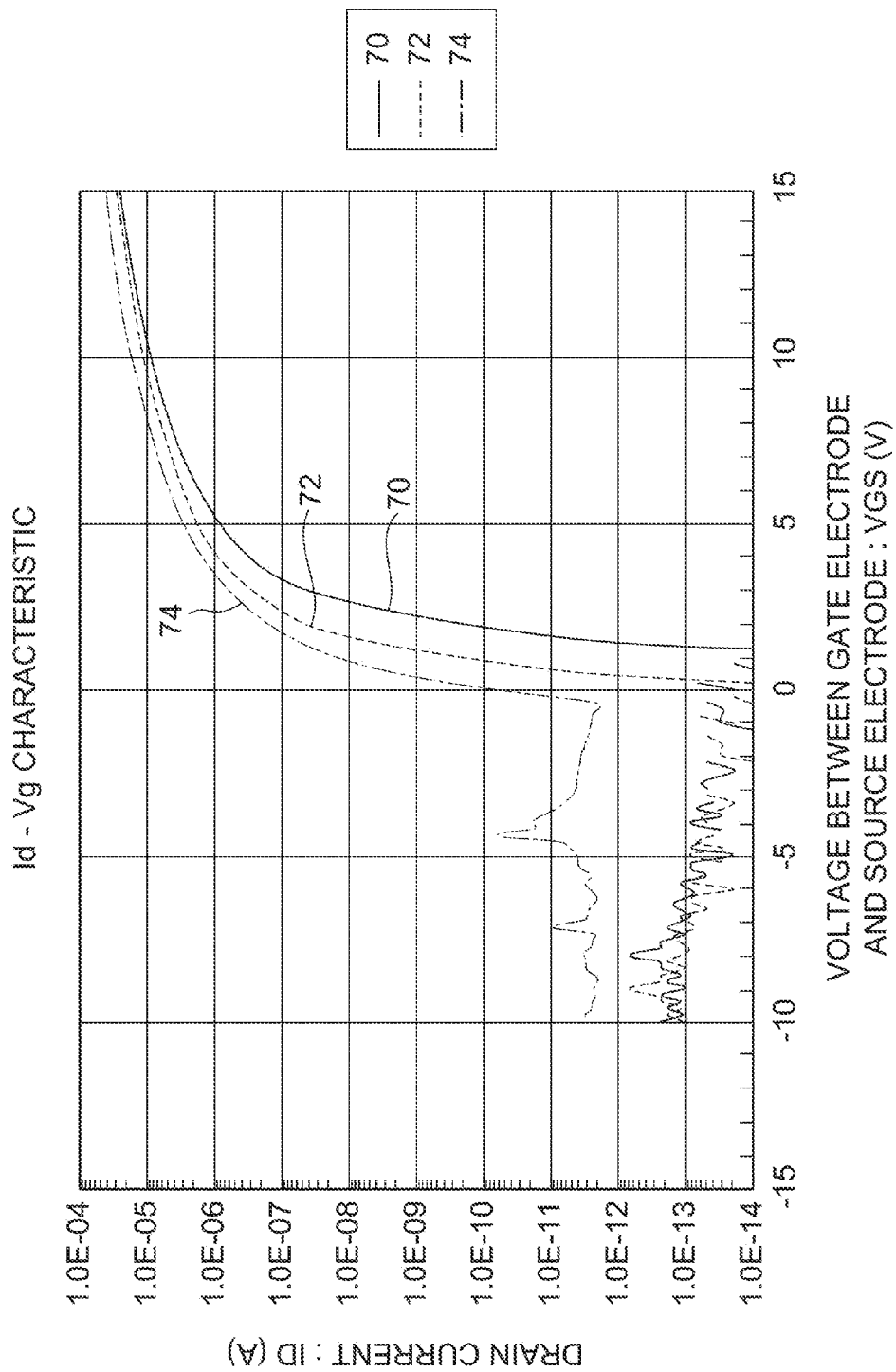

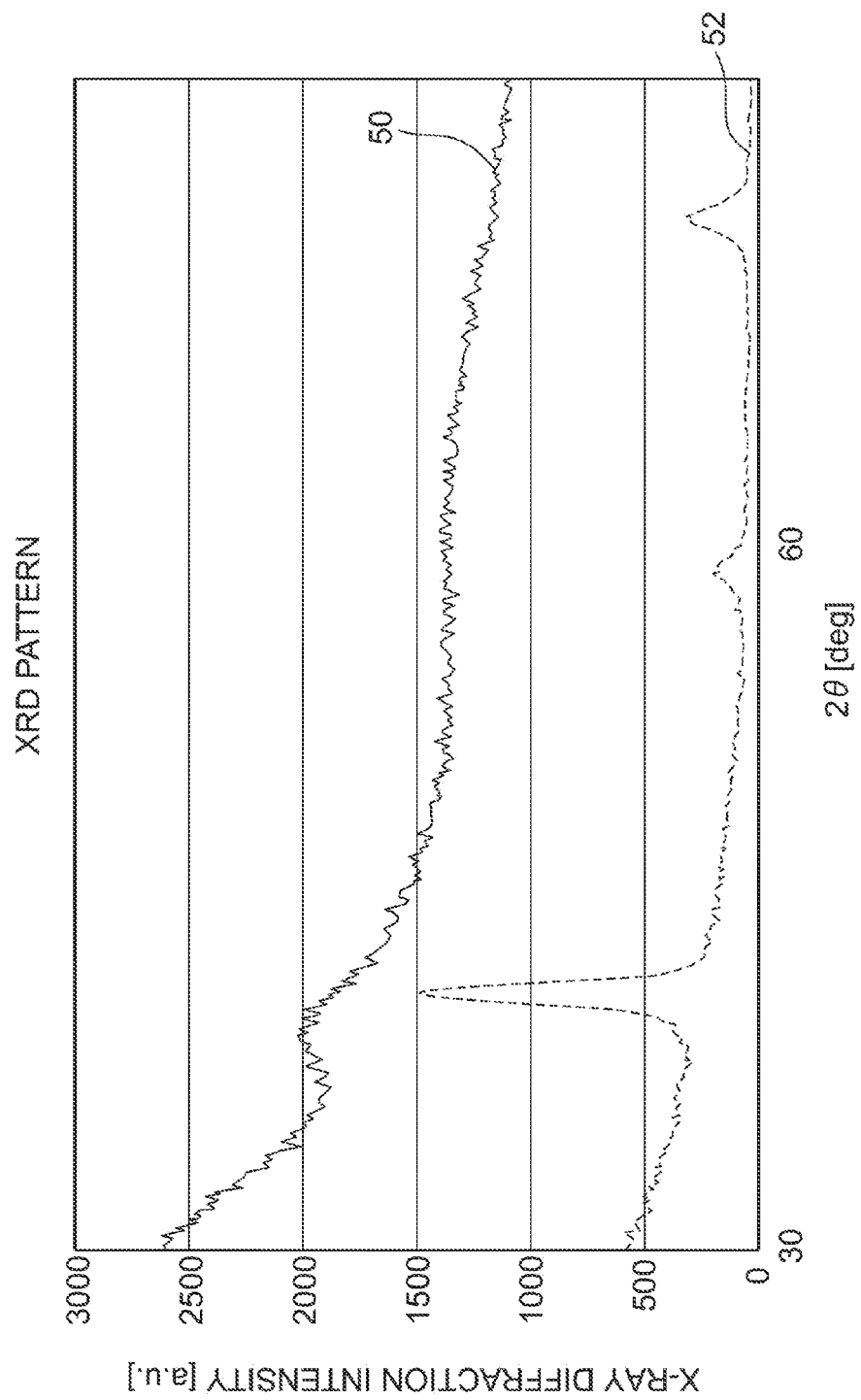

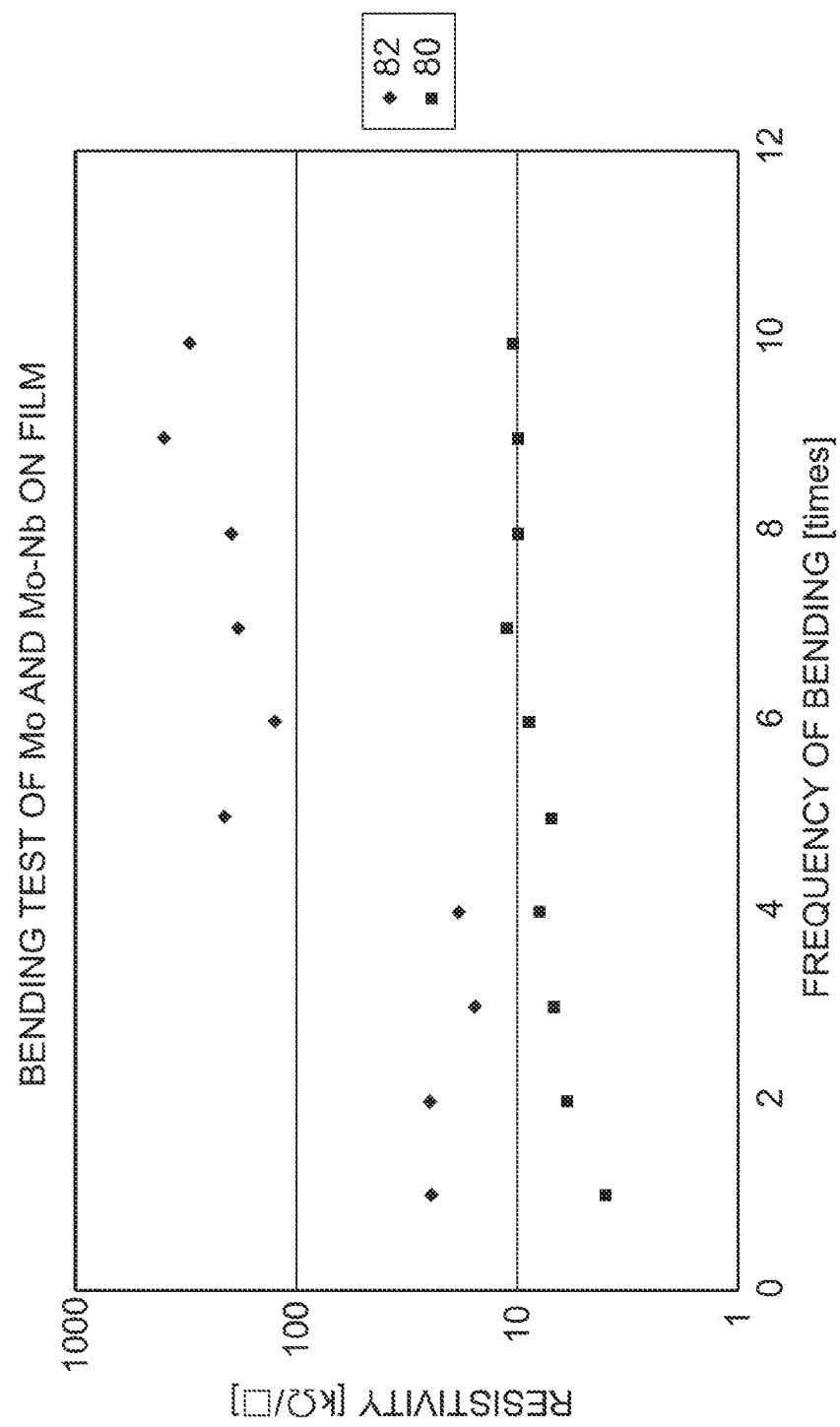

ELECTRONIC DEVICE AND METHOD FOR PRODUCING THE SAME

CROSS-REFERENCE TO RELATED APPLICATION

This application claims priority under 35 USC 119 from Japanese Patent Application No. 2009-162625, filed on Jul. 9, 2009, the disclosure of which is incorporated by reference herein.

BACKGROUND OF THE INVENTION

1. Field of the Invention

The present invention relates to an electronic device and a method for producing the electronic device.

2. Description of the Related Art

Electronic devices such as field-effect transistors and condensers (capacitors) are generally equipped with at least two electrodes with an insulating film interposed between the at least two electrodes. Such electronic devices such as thin film transistors or the like have been applied to flat panel displays (FPDs) employing liquid crystal elements, organic electroluminescence elements (hereinafter, referred to as "organic EL elements" in some cases) in which a thin film material that emits light by excitation due to application of an electric current is used, or the like; X-ray sensors; or the like.

An electronic device is generally formed by forming a first electrode on a substrate and then providing a second electrode on the first electrode with an insulating film interposed between the first electrode and the second electrode. When the electronic device is a bottom-gate type field-effect transistor, the first electrode functions as a gate electrode, and the second electrode functions as a source electrode and a drain electrode. Mo (molybdenum) is used as a constituent material of the first electrode in consideration of adhesion between the first electrode and the insulating film that is disposed on the first electrode (see, for example, Japanese Patent Application Laid-Open (JP-A) No. 2007-250982).

In the electronic device, the first electrode and the second electrode are electrically separated by the insulating film. However, there are cases where a leak current occurs between the first electrode and the second electrode. Since the occurrence of the leak current causes deterioration in electronic device characteristics, attempts for suppressing the leak current have been made.

As a method for suppressing the leak current, a method of adjusting the taper angle of an edge cross section of the first electrode to an angle of a degree being possible to suppress the leak current is described. This method aims for improving the adhesion between the first electrode and the insulating film by adjusting the taper angle of the edge cross section of the first electrode to be as small as possible, thereby suppressing the occurrence of cavities or cracks in the insulating film in the neighborhood of the edge of the first electrode, and suppressing the leak current.

However, when the first electrode includes Mo, it is difficult to adjust the taper angle of the edge cross section of the first electrode to an angle of a degree being possible to suppress the leak current. Further, when the first electrode includes Mo, while it depends on the method of forming an insulating film employed, a covering property of the insulating film with respect to the taper portion of the first electrode may be considerably deteriorated, cavities or cracks in the insulating film in the neighborhood of the edge of the first electrode may occur and, as a result of which, the leak current may further increase.

As another method for suppressing the leak current, JP-A No. 2008-219008 discloses to employ an insulating film having a two-layer configuration of a layer including $SiO_2$ and a layer including SiN. However, according to the technology disclosed in JP-A No. 2008-219008, the layer configuration of the insulating film should be changed (to have a two-layer configuration) in order to suppress the leak current, whereby it may cause complication in the configuration or manufacturing processes.

SUMMARY OF THE INVENTION

The present invention has been made in view of the above circumstances and provides an electronic device and a method for producing the same.

A first aspect of the present invention provides an electronic device comprising: a first electrode that is provided on a substrate and includes an Mo—Nb alloy; an insulating film disposed on the first electrode; and a second electrode disposed on the first electrode with at least the insulating film interposed between the first electrode and the second electrode.

A second aspect of the present invention provides a method for producing an electronic device, the method comprising: forming, on a substrate, a first electrode that includes an Mo—Nb alloy, by patterning a metal film that is formed on the substrate and includes the Mo—Nb alloy; forming an insulating film, that covers at least a part of the first electrode, in accordance with a sputtering method; and forming a second electrode so as to be disposed on the first electrode with at least the insulating film interposed between the first electrode and the second electrode.

BRIEF DESCRIPTION OF THE DRAWINGS

FIG. 8 is a diagram showing the measurement results of current-voltage characteristics in the example.

FIG. 9 is a diagram showing the analysis results of XRD (X-ray diffraction) of the first electrode in the example.

FIG. 10 is a diagram showing the relationship between frequency of bending and resistivity in the example.

DETAILED DESCRIPTION OF THE INVENTION

Figure 1:
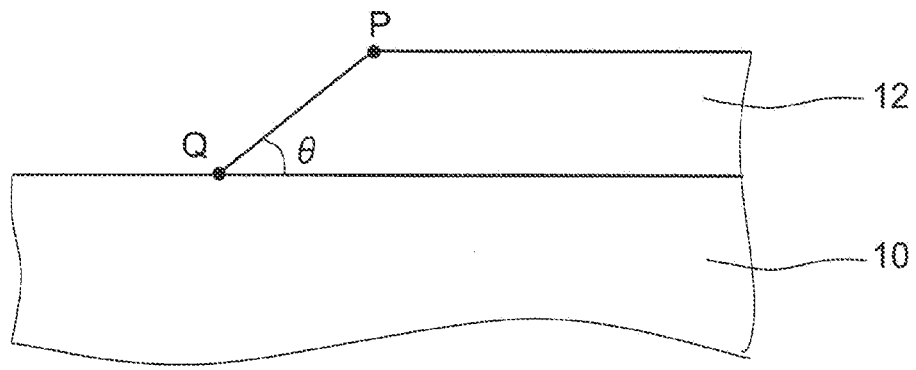
FIG. 1 is a diagram showing one example of the taper angle of an edge cross section of the first electrode.

The electronic device of the present invention is an electronic device having a first electrode that is provided on a substrate and includes an Mo—Nb (molybdenum-niobium) alloy, an insulating film disposed on the first electrode, and a second electrode disposed on the first electrode with at least the insulating film interposed between the first electrode and the second electrode.

The present inventors have found that, in an electronic device such as a condenser (capacitor) or a field-effect transistor, by constituting the first electrode from the Mo—Nb alloy, a taper angle of an edge cross section of the first electrode can be adjusted to an angle with which the leak current is remarkably suppressed.

Here, the term "electrode" refers to as a layer that exhibits electric conductivity (the volume resistivity thereof is $1\times10^{-6}$ Ωcm or less). Therefore, the first electrode (and the second electrode) has (have) electric conductivity. For the layer configured as the electrode, a material that exhibits electric conductivity is used, and generally, there is a tendency to avoid a configuration including a material that inhibits electric conductivity. Since Mo is a material having electric conductivity, it is general to use Mo as a constituent material of the first electrode. However, Nb (niobium) is a material having an electrically insulating property (the volume resistivity thereof is $1\times10^{14}$ Ωcm or more). Therefore, conventionally, the use of Nb as a constituent material of the layer configured as an electrode has not been thought. It is general to select a material that lowers the content of such electrically insulating material.

The present inventors dared to use Nb, which has not been conventionally thought to be for use as a constituent material of an electrode for reasons of deterioration in electric conductivity, and have found that an electronic device in which a leak current is suppressed can be provided by constituting the first electrode from an Mo—Nb alloy.

Note that, by constituting the first electrode from the Mo—Nb alloy, it is possible to adjust the taper angle of the edge cross section of the first electrode to an angle of a degree with which the leak current is remarkably suppressed. In this first electrode that includes the Mo—Nb alloy, the taper angle can be made smaller as the content of Nb (atomic %) in the Mo—Nb alloy becomes greater. However, because Nb has an electrically insulating property as described above, electric conductivity of the Mo—Nb alloy gets lower as the content of Nb (atomic %) in the Mo—Nb alloy becomes greater.

Therefore, it is enough that the content of Nb in the Mo—Nb alloy is a content that does not spoil the function of the first electrode as an "electrode", and realizes the taper angle with which the leak current is suppressed. It is enough that the content of Nb in the Mo—Nb alloy is suitably adjusted according to the intended use.

Further, as described above, since it is possible to adjust the taper angle of the edge cross section of the first electrode to an angle with which the leak current is remarkably suppressed, even in the case of forming the insulating film, that is provided on this first electrode, by a sputtering method, the occurrence of the leak current may be effectively suppressed.

Such film formation by a sputtering method has a high rectilinear propagation property (the direction of film formation is rectilinear) as compared with other film forming methods such as CVD (chemical vapor deposition) and the like. Therefore, when the insulating film is formed by the sputtering method, as the taper angle of the edge cross section of the first electrode gets greater, the covering property of the insulating film with respect to the first electrode may be remarkably deteriorated, and cavities or cracks in the insulating film in the neighborhood of the edge of the first electrode may occur easier. As a result, there is a tendency for the leak current to increase. However, in the electronic device of the present invention, the above taper angle of the edge cross section of the first electrode can be made smaller to reach an angle of a degree with which the leak current is remarkably suppressed. For the reasons described above, the occurrence of the leak current may be effectively suppressed, even in the case of forming the insulating film, which is provided on the fist electrode, by the sputtering method.

Note that, in the present invention, the "taper angle of the edge cross section" of the first electrode means an angle formed by the side face of the first electrode and the contact face of the first electrode with the substrate. The "side face of the first electrode" means a face which intersects the contact face of the first electrode with the substrate and a face opposed to the contact face of the first electrode (hereinafter, referred to as an "upper face" in some cases), among the faces of the first electrode. Note that, henceforth, the "taper angle of the edge cross section" is simply referred to as the "taper angle" in some cases.

The taper angle of the first electrode provided on the substrate is explained in more detail with reference to FIG. 1 to FIG. 3.

Figure 2:
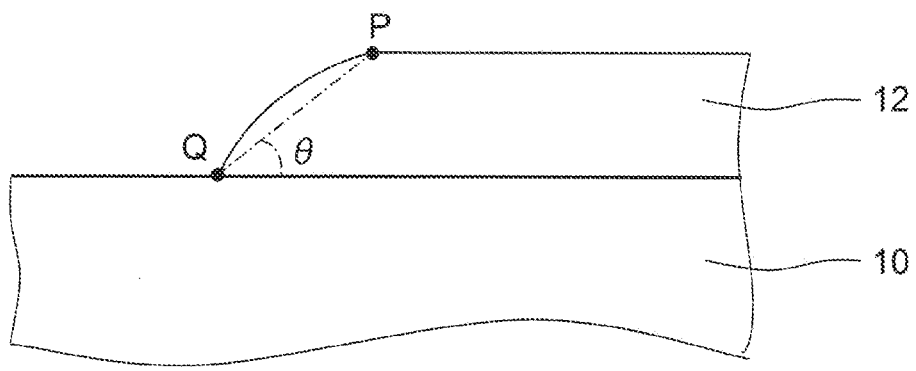
FIG. 2 is a diagram showing another example of the taper angle of an edge cross section of the first electrode.
Figure 3:
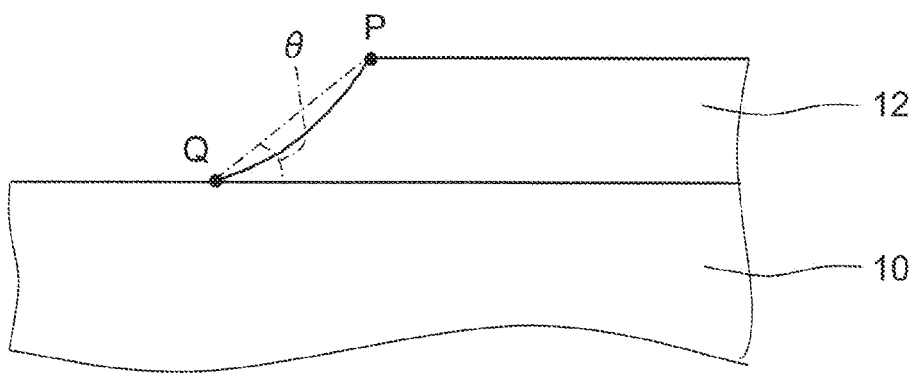
FIG. 3 is a diagram showing yet another example of the taper angle of an edge cross section of the first electrode.

FIG. 1 to FIG. 3 are each a cross-sectional diagram schematically showing a substrate 10 and a first electrode 12 that is provided on the substrate 10.

As shown in FIG. 1, the taper angle θ of the first electrode 12 is an angle formed by the side face of the first electrode 12 and the contact face of the first electrode 12 with the substrate 10. Specifically, the taper angle is an angle (θ in FIG. 1) formed by a straight line P-Q, which connects the upper edge P and the lower edge Q of the first electrode 12, and another straight line which corresponds to the contact face of the first electrode 12 with the substrate 10. This lower edge Q shows the border line between the contact face of the first electrode 12 with the substrate 10 and the side face of the first electrode 12. Further, the upper edge P shows the border line between the face of a side that is opposed to the contact face of the first electrode 12 and the side face of the first electrode 12.

Note that, in FIG. 1, an embodiment in which the side face of the first electrode 12 is a plane surface is shown; however, also in the case in which the side face of the first electrode 12 is a curved face (for example, in the case of FIG. 2 and FIG. 3 described below), the taper angle is defined similarly. FIG. 2 shows an example of a case in which the side face of the first electrode 12 is a curved face protruding toward the outside of the first electrode 12. FIG. 3 shows an example of another case in which the side face of the first electrode 12 is a curved face that is recessed toward the inside of the first electrode 12.

In FIG. 2 and FIG. 3, the taper angle θ of the first electrode 12 is an angle formed by a straight line P-Q, which connects the upper edge P and the lower edge Q of the first electrode 12 (shown by an alternate long and short dash line, in FIG. 2 and FIG. 3), and another straight line which corresponds to the contact face of the first electrode 12 with the substrate 10.

The electronic device of the present invention having the configuration as described above may be used as a condenser or a field-effect transistor.

Next, the constituent materials of the electronic device are explained in detail.

<Substrate>

There is no particular limitation on the substrate (substrate 10 in FIG. 1 to FIG. 3) used in the electronic device. Examples of the substrate include inorganic substrates of glass, YSZ (zirconia-stabilized yttrium), or the like; and organic materials such as polyester, for example, polyethylene terephthalate (PET), polybutylene terephthalate, or polyethylene naphthalate (PEN), polystyrene, polycarbonate, polyethersulfone, polyarylate, allyl diglycol carbonate, polyimide, polycycloolefin, norbornene resin, and polychlorotrifluoroethylene. In the case of employing the organic material described above as the constituent material of the substrate, it is preferable to select a material that has an excellent thermal resistance, dimensional stability, solvent resistance, electrically insulating property, and workability, and has a low gas permeability or a low hygroscopic property.

The substrate preferably has flexibility. From the viewpoint of having flexibility, it is preferable to use an organic plastic film that is prepared by making the organic material described above in a film shape.

Note that, the term "flexibility" denotes a degree of liability of bending (liability of flexure). It means that flexibility is greater, as bending is easier carried out with a small external force.

Herein, when the first electrode includes an Mo—Nb alloy, as compared with the case of constituting the first electrode from Mo, an effect of improving adhesion between the first electrode and other layer provided in contact with the first electrode is obtained (which is described below in detail). Therefore, even in the case of employing a support having flexibility, it is hard to separate the first electrode from the support, and an electronic device can be provided in which deterioration in characteristics due to the separation is suppressed.

The thickness of the substrate is preferably from 50 μm to 500 μm. When the thickness of the substrate is 50 μm or more, the substrate itself can maintain a sufficient flatness. When the thickness of the substrate is 500 μm or less, the substrate itself can be freely bended, that is, the flexibility of the substrate itself is preferable.

<First Electrode>

As described above, the electronic device of the present invention may be used as a condenser or a field-effect transistor. When the electronic device of the present invention is used as a bottom-gate type field-effect transistor, the first electrode is a gate electrode of the field-effect transistor. When the electronic device of the present invention is used as a condenser, the first electrode is an electrode provided on the substrate side among a pair of electrodes which constitutes the condenser.

The first electrode (first electrode 12 in FIG. 1 to FIG. 3) includes an Mo—Nb alloy, as described above. By constituting the first electrode from the Mo—Nb alloy, it becomes possible to reduce the taper angle of the edge cross section of the first electrode to an angle of a degree with which the leak current is suppressed.

The taper angle of the edge cross section of the first electrode is preferably less than 50°, and more preferably less than 40°, as an angle with which the leak current is remarkably suppressed. When the taper angle of the first electrode is less than 50°, the leak current is extremely effectively suppressed.

Note that, when the first electrode includes Mo alone, it is difficult to adjust the taper angle of the edge cross section of the first electrode to an angle of a degree with which the leak current is remarkably suppressed, and specifically, it is difficult to adjust the taper angle to less than 50°.

Further, in the present invention, by constituting the first electrode from the Mo—Nb alloy, the leak current can be suppressed with a simple configuration, without changing the configuration of the electronic device such as configuring the insulating film to have a two-layer configuration in order to suppress the leak current, as the conventional technology, or the like.

It is preferable that the Mo—Nb alloy which constitutes the first electrode is amorphous. In the invention, the "Mo—Nb alloy is amorphous" means that the Mo—Nb alloy is amorphous when compared with a simple substance of Mo. Specifically, the "Mo—Nb alloy is amorphous" indicates that the peak obtained by the measurement result of X-ray diffraction on the first electrode including the Mo—Nb alloy is broader as compared with the peak obtained by the measurement result of X-ray diffraction on the first electrode including Mo alone (that is, the Mo—Nb alloy is in a state of being worse in crystallinity).

When the Mo—Nb alloy which is included in the first electrode is amorphous, the flatness of the upper face (the face of a side which is opposed to the substrate), lower face (the contact face with the substrate), and side face of the first electrode is improved. Further, when a sputtering method is used as a film forming method of the first electrode, the flatness of the upper face, lower face and side face of the first electrode is further improved.

Moreover, when the Mo—Nb alloy that is included in the first electrode is amorphous, the adhesion between the lower face of the first electrode and the substrate becomes good. Therefore, for example, even in the case of using a substrate, which is difficult to be for use when the first electrode includes Mo alone because of having low adhesion, a good adhesion between the substrate and the first electrode can be obtained. Further, even in the case of using, as a substrate, a substrate having flexibility as described above, since the adhesion between the substrate and the first electrode is excellent, the occurrence of cracks in the first electrode is suppressed even when the electronic device is bended.

The surface roughness Ra of the first electrode is preferably 0.6 nm or less, and more preferably 0.4 nm or less. When the surface roughness Ra of the first electrode is 0.6 nm or less, the adhesion between the first electrode and the insulating film that is provided on the first electrode is improved.

In the present invention, by constituting the first electrode from an amorphous Mo—Nb alloy, the above surface roughness may be easily realized.

Here, the "surface roughness" is an average of the values of surface roughness Ra obtained from three line profiles of a scanning distance of 1 μm in an AFM (atomic force microscope) image of a 1-micrometer-square sample of a measurement object (the measurement range is 1 μm×1 μm). Note that, the AFM image is obtained using an atomic force microscope (AFM; trade name: NANO-R, manufactured by Pacific Nanotechnology, Inc.).

Further, by constituting the first electrode of the electronic device in the present invention from an Mo—Nb alloy as described above, as compared with the case of constituting the first electrode from Mo alone, membrane stress may be reduced, and adhesion between the first electrode and the substrate (substrate 10 in FIG. 1 to FIG. 3) may be improved.

The above "membrane stress" is calculated according to the following method. An Si (silicon) wafer substrate is prepared, and a laminated body is prepared by forming a metal film, which includes the constituent material of the first electrode, on the Si wafer substrate. With regard to each of the Si wafer substrate and the laminated body, the curvature radius is measured using FLX-2320-S (trade name, manufactured by Toho Technology Corporation). The difference between these curvature radiuses is calculated to give a value of membrane stress. Note that, the laminated body used is prepared by forming a metal film, which includes the constituent material of the first electrode, on the Si wafer substrate to have a desired thickness in accordance with a sputtering method.

The thickness of the first electrode is preferably from 10 nm to 100 nm, more preferably from 20 nm to 100 nm, and particularly preferably from 40 nm to 100 nm, from the viewpoint of securing electric resistance of wires and, at the same time, to be sufficiently covered by the insulating film.

The first electrode is formed by forming a metal film including the Mo—Nb alloy on the substrate, and then patterning the metal film (first electrode formation process).

The film forming method of the metal film including the Mo—Nb alloy is not particularly limited, and may be selected from physical methods such as a sputtering method and an ion plating method. Among them, a sputtering method is preferably employed from the viewpoint of improvement in smoothness of the surface. In the case of employing the sputtering method, an Mo—Nb alloy may be used as a target, or a simple substance of Mo and a simple substance of Nb may be each used as a target to undergo film formation by co-sputtering.

There is no particular limitation as to the method (processing method) of patterning the metal film including the Mo—Nb alloy. A photo-etching method, in which the metal film formed as described above is processed by photolithography and etching (wet etching or dry etching), may be adopted, or a lift-off method, in which resist pattern formation, the above-described metal film formation, and resist separation are carried out in this order, may be adopted. Further, a shadow mask method may be adopted, in which a shadow mask is used at the time of film formation of the above-described metal film so as to perform film formation and patterning at the same time.

Above all, processing by etching is preferable for reasons of easiness in process, and processing by wet etching is more preferable for reasons of the easiness in process.

Here, as described above, by constituting the first electrode from the Mo—Nb alloy, it becomes possible to adjust the taper angle of the first electrode to an angle with which a leak current is suppressed. Specifically, as the method of adjusting the taper angle within the above-described range of less than 50° (hereinafter, simply referred to as "taperization" in some cases), since the taper angle becomes smaller as the content of Nb in the Mo—Nb alloy gets greater as described above, a method of adjusting the content of Nb within the range that does not spoil the electric conductivity of the first electrode is described.

Further, other than the method of adjusting the Nb content, a method of adjusting the etching conditions upon processing the first electrode by a photo-etching method, after forming the metal film including the Mo—Nb alloy, may be used.

Specifically, for example, in the case of wet etching, a method of using a diluted etchant is described. As the concentration of the etchant gets lower, the etching rate becomes lower, and the taper angle tends to become smaller.

Further, a method of adjusting the taper angle by adjusting the adhesion with respect to the resist pattern (the resist pattern formed by using a photo-resist) is described. The taper angle can be made smaller, when the adhesion with respect to the resist pattern is worse. The adhesion with respect to the resist pattern can be adjusted by adjusting the post-bake temperature of the resist pattern (for example, as the post-bake temperature is lower, the adhesion tends to get worse).

In the case of dry etching, by mixing oxygen into the etching gas, etching of the metal film can be performed while the resist pattern is retreated by the etching. Therefore, the taper angle of the first electrode can be easily adjusted to an ideal taper angle with which the leak current is suppressed.

Note that, even in the case where etching is performed under the same etching conditions, the etching rate of the metal film that is constituted from Mo alone is higher than the etching rate of the metal film that includes the Mo—Nb alloy. Therefore, it is difficult to adjust the taper angle of the first electrode, which is prepared from the metal film constituted from Mo alone, to less than 50°. On the contrary, the taper angle of the first electrode which is prepared from the metal film including the Mo—Nb alloy is easily adjusted to less than 50°, by adjusting the above etching conditions for etching the metal film including the Mo—Nb alloy. Therefore, the taper angle of the first electrode which is prepared from the metal film including the Mo—Nb alloy is easily adjusted to an ideal taper angle with which the leak current is remarkably suppressed, without causing reduction in wire width.

Further, since the first electrode in the electronic device of the present invention includes the Mo—Nb alloy, even in the case where the first electrode is formed by patterning through the above etching of the metal film that is constituted from the Mo—Nb alloy, reduction in the wire width of the first electrode due to etching is suppressed. This is because the etching rate is slower as compared with the case of patterning the metal film that is constituted from Mo alone under the same etching conditions.

Note that, the taper angle of the first electrode can be adjusted to an angle with which the leak current is effectively suppressed by constituting the first electrode from the Mo—Nb alloy, however, there is concern that an effective area of the first electrode gets greater as the taper angle becomes smaller. Therefore, it is preferable that a taper portion (a region of an edge in a plane direction of the first electrode, that is a region from the inclined side face down to the lower face (the contact face of the first electrode with the substrate)) of the first electrode is subjected to an acid treatment. By performing the acid treatment, the taper portion of the first electrode is electrically insulated, whereby the expansion of the effective area of the first electrode is suppressed. Further, concentration of electric field at the taper portion of the first electrode is suppressed.

There is no particular limitation as to the method for acid treatment and, for example, an oxygen plasma treatment or a UV (ultra violet) ozone treatment may be used. These treatments may be used in combination. There is no particular limitation on the conditions of the oxygen plasma treatment and, for example, it is good to conduct the oxygen plasma treatment under the conditions of an oxygen pressure of from 0.5 Pa to 50 Pa, and an RF (radio frequency) power of from 50 W to 1000 W, for a period of from 10 seconds to 2 minutes. There is no particular limitation on the conditions of the UV ozone treatment, however, it is preferable that the wavelengths of UV rays (ultra violet rays) used in the UV ozone treatment are in a range of from 180 nm to 300 nm.

<Insulating Film>

As a material of the insulating film that is disposed on the first electrode, an insulator such as $SiO_2$, $SiN_x$, $SiON$, $Al_2O_3$, $Y_2O_3$, $Ta_2O_5$, $HfO_2$, or the like, or a mixed crystal compound containing at least two of these compounds may be used. Further, a polymer insulator such as polyimide may be also used as a material of the insulating film.

The film thickness of the insulating film is preferably from 10 nm to 1000 nm, more preferably from 50 nm to 500 nm, and particularly preferably from 100 nm to 300 nm.

The insulating film should be thick to a certain extent in order to reduce the leak current and to improve the voltage resistance. However, when the insulating film is too thick, in the case of using the electronic device as a field-effect transistor, a rise in driving voltage is caused in this field-effect transistor. Therefore, it is preferred that the film thickness of the insulating film is within the range described above.

The method of forming the insulating film is not particularly limited, and the method of forming the insulating film may be selected according to the materials or the like. For instance, a sputtering method may be employed (insulating film formation process).

Here, as described above, since film formation by a sputtering method has a high rectilinear propagation property, it is difficult to perform film formation which has detailed coverage upon film formation. Therefore, as the taper angle of the edge cross section of the first electrode becomes greater, cavities or cracks in the insulating film in the vicinity of the edge of the first electrode easily occur, and as a result thereof, leak current increases. Conventionally, the first electrode is constituted from Mo, and with the first electrode constituted from Mo alone it is difficult to make the taper angle of the edge cross section small enough to an extent that leak current does not occur. Specifically, with the first electrode constituted from Mo alone it is difficult to adjust the taper angle of the edge cross section to less than 50°.

On the contrary, as described above, since the first electrode includes an Mo—Nb alloy in the present invention, the taper angle of the edge cross section can be made smaller, as compared with the case in which the first electrode is constituted from Mo alone. Therefore, even in the case where the sputtering method is employed as a method of forming the insulating film, the occurrence of cavities or cracks in the insulating film in the neighborhood of the edge of the first electrode is suppressed.

Note that, it is enough that the insulating film in the present invention is provided so as to cover at least a part of the first electrode on the substrate.

An embodiment, in which the insulating film is provided on the whole surface including the region on the first electrode (excluding a terminal area for applying voltage) that is disposed on the substrate and the region other than the first electrode, is described as one example of the embodiment of the insulating film in the present invention. In the terminal area, the insulating film is not formed, and the first electrode is not covered. The region where the first electrode is not covered can be provided upon forming (processing) the insulating film in accordance with, for example, a photo-etching method, a lift-off method, a shadow mask method, or the like.

<Second Electrode>

As described above, the electronic device of the present invention may be used as a condenser (capacitor) or a field-effect transistor. When the electronic device of the invention is a condenser, the second electrode is an electrode which is one electrode of a pair of electrodes that constitutes the condenser and is arranged so as to be opposed to the first electrode with the insulating film interposed between the first electrode and the second electrode. Further, when the electronic device of the invention is, for example, a bottom-gate type field-effect transistor, the second electrode is a source electrode and a drain electrode of the field-effect transistor.

There is no particular limitation on the material that constitutes the second electrode. Preferable examples of the material that constitutes the second electrode include metals such as Al, Mo, Cr, Ta, Ti, Au, and Ag; alloys such as Al—Nd (aluminum-neodymium) and APC (AgPdCu alloy); electrically conductive oxide films of tin oxide, zinc oxide, indium oxide, indium tin oxide (ITO), indium zinc oxide (IZO), or the like; electrically conductive organic compounds such as polyaniline, polythiophene, and polypyrrole; and mixtures thereof. Among them, metals and alloys are preferable from the viewpoint of having a low electric resistance.

Note that, the second electrode may include the same material as the material (Mo—Nb alloy) of the first electrode.

The thickness of the second electrode that is formed is preferably from 20 nm to 1000 nm, and more preferably from 50 nm to 500 nm.

The method of forming the second electrode is not particularly limited. The second electrode can be formed on the substrate in accordance with a method which is appropriately selected from among wet methods such as a printing method and a coating method; physical methods such as a vacuum deposition method, a sputtering method, and an ion plating method; chemical methods such as CVD and plasma CVD methods, in consideration of the suitability to the material described above. For instance, when a metal or an alloy is selected as the material of the second electrode, the second electrode can be formed in accordance with a direct-current sputtering method, a radio-frequency sputtering method, a vacuum deposition method, an ion plating method, or the like. Further, when an electrically conductive organic compound is selected as the material of the second electrode, the second electrode can be formed in accordance with a wet film forming method.

The second electrode may be subjected to patterning, if necessary. Concerning the method of patterning, the above-described photo-etching method, lift-off method, shadow mask method, or the like may be applied without any particular limitation.

In the following, the case where the electronic device of the invention is used as a condenser and the case where the electronic device of the invention is used as a bottom-gate type field-effect transistor are explained in detail.

Figure 4:
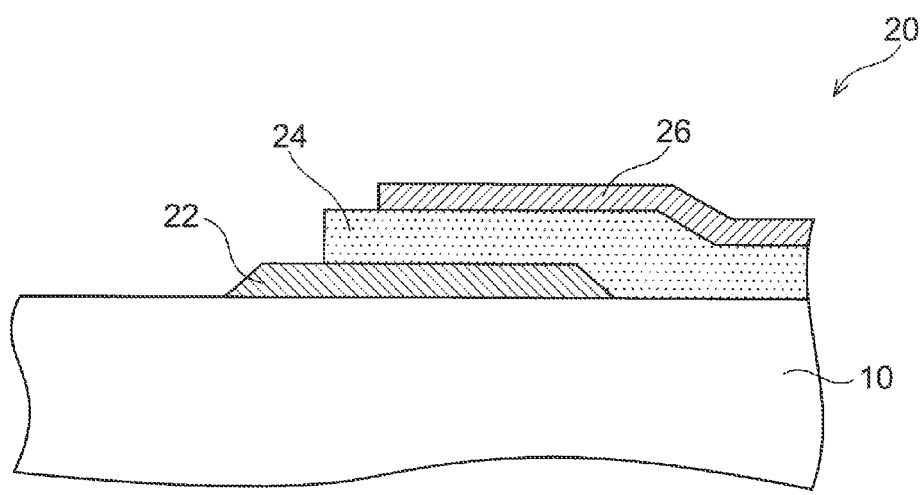
FIG. 4 is a schematic cross-sectional diagram showing one example of a case where the electronic device is used as a condenser.

A schematic cross-sectional diagram of a condenser 20, which is an electronic device of the present invention, is shown in FIG. 4.

As shown in FIG. 4, the condenser 20 has a configuration in which a first electrode 22, an insulating film 24, and a second electrode 26 are laminated in this order on a substrate 10.

In the condenser 20, when voltage is applied between the first electrode 22 and the second electrode 26, capacity is accumulated in the region of the insulating film 24 which is sandwiched between the first electrode 22 and the second electrode 26. Here, as explained above, since the first electrode 22 includes the Mo—Nb alloy, a leak current between the first electrode 22 and the second electrode 26 is suppressed.

Figure 5:
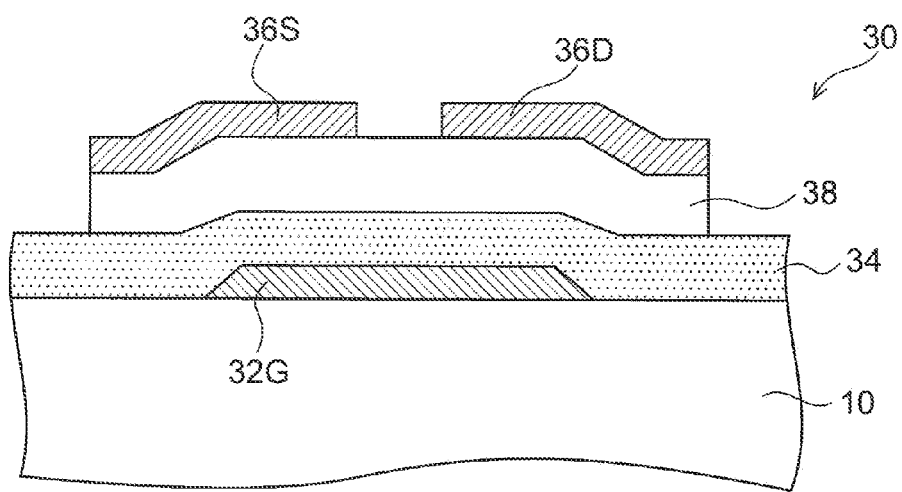
FIG. 5 is a schematic cross-sectional diagram showing one example of a case where the electronic device is used as a bottom-gate type field-effect transistor.

A schematic cross-sectional diagram of a field-effect transistor 30, which is an electronic device of the present invention, is shown in FIG. 5. As shown in FIG. 5, the field-effect transistor 30 has a configuration in which a gate electrode 32G as the first electrode; a gate insulating film 34 as the insulating film; an active layer 38 which is disposed on the gate insulating film 34 and is patterned into an island shape; and a source electrode 36S as the second electrode and a drain electrode 36D as the second electrode are laminated on a substrate 10. Namely, the field-effect transistor 30 shown in FIG. 5 is a bottom-gate type (an inversely-staggered type) field-effect transistor, and is a field-effect transistor of a top-contact type in which the source electrode 36S and the drain electrode 36D are in contact with the upper face side (opposite side from the substrate 10) of the active layer 38.

The active layer 38 has an oxide semiconductor as the principal constituent. Here, the term "principal constituent" denotes the constituent component which is contained in the greatest amount, among the constituent components contained in the active layer 38. The content of the "principal constituent" is preferably 50% or higher. Since the oxide semiconductor can undergo film formation at a low temperature, the oxide semiconductor film is preferably formed on a film-shaped substrate 10 having flexibility or on the gate electrode 32G.

As the oxide semiconductor, an oxide semiconductor including at least one selected from the group consisting of In, Ga, and Zn, or a complex oxide thereof is preferable. An amorphous oxide semiconductor (IGZO) described in JP-A No. 2006-165529 is particularly preferable.

Here, as explained above, since the gate electrode 32G includes the Mo—Nb alloy, a leak current between the gate electrode 32G and either one or both of the source electrode 36S and the drain electrode 36D in the field-effect transistor 30 is suppressed. As a result, the OFF current is reduced, and good transistor characteristics with a high ON/OFF ratio [ON current/OFF current] are obtained.

Figure 6:
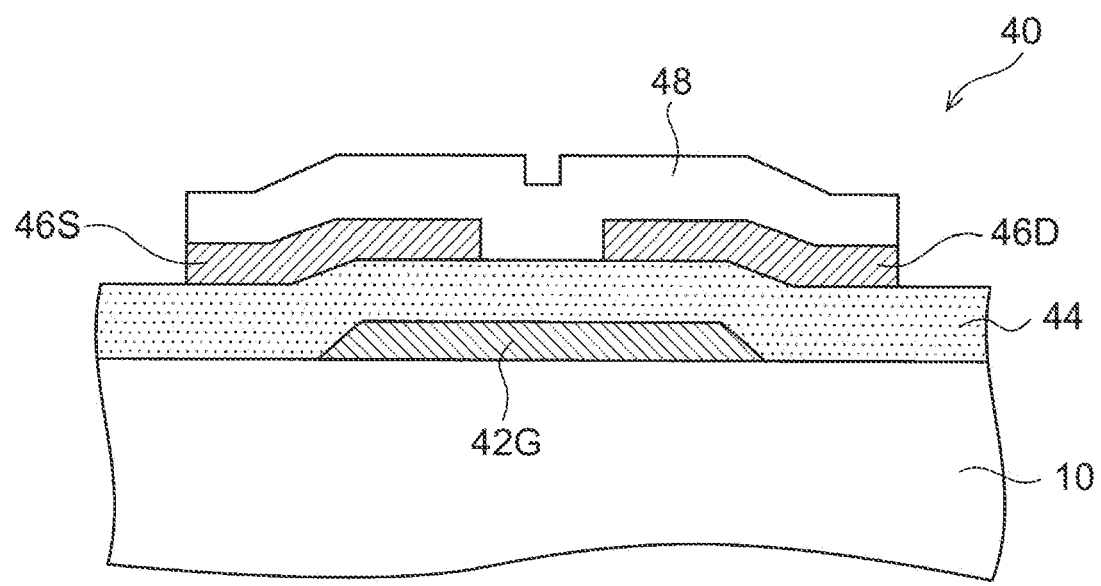
FIG. 6 is a schematic cross-sectional diagram showing one example of a case where the electronic device is used as another bottom-gate type field-effect transistor.

A schematic cross-sectional diagram of another field-effect transistor 40, which is an electronic device of the present invention, is shown in FIG. 6. As shown in FIG. 6, the field-effect transistor 40 has a configuration in which a gate electrode 42G as the first electrode; a gate insulating film 44 as the insulating film; a source electrode 46S as the second electrode and a drain electrode 46D as the second electrode; and an active layer 48 are laminated on a substrate 10. Namely, the field-effect transistor 40 shown in FIG. 6 is a bottom-gate type (an inversely-staggered type) field-effect transistor, and is a field-effect transistor of a bottom-contact type in which the source electrode 46S and the drain electrode 46D are in contact with the lower face side (substrate 10 side) of the active layer 48. The active layer 48 has a configuration substantially the same as the configuration of the above active layer 38, so explanation thereof is omitted.

Herein, as explained above, since the gate electrode 42G as the first electrode includes the Mo—Nb alloy, a leak current between the gate electrode 42G and either one or both of the source electrode 46S and the drain electrode 46D in the field-effect transistor 40 is suppressed. As a result, the OFF current is reduced, and good transistor characteristics with a high ON/OFF ratio [ON current/OFF current] are obtained.

In the above description, the case where the electronic device of the invention is used as a condenser and the case where the electronic device of the invention is used as a field-effect transistor are specifically explained, however, the application range of the electronic device of the present invention is not limited to these cases.

Further, there is no particular limitation concerning the application of the electronic device of the present invention. For example, the electronic device of the present invention can be appropriately applied for use in displays such as organic EL displays or liquid crystal displays, electromagnetic wave detectors (for example, X-ray sensors, ultraviolet radiation sensors, or the like), biosensors, odor sensors, or the like. Particularly, the electronic device of the present invention is preferably applied to displays.

EXAMPLES

In the following, the present invention will be further described in detail with reference to the examples, but it should be construed that the invention is not limited to these examples.

Example 1

Preparation of Electronic Device 1 as Field-Effect Transistor (Formation of First Electrode as Gate Electrode)

A PEN film (polyethylene naphthalate film; trade name: Q65FA, manufactured by DuPont Teijin Films) having a thickness of 150 μm was prepared as a substrate. On this substrate, a metal film which included an Mo—Nb alloy (Mo: 95 atomic %, Nb: 5 atomic %) and had a film thickness of 40 nm was formed by a sputtering method. The sputtering conditions are described below.

—Sputtering Conditions for Metal Film of Mo—Nb Alloy—

Sputtering apparatus: DC (direct current) magnetron sputtering apparatus

Target: 4-inch diameter Mo—Nb alloy target (Mo: 95 atomic %, Nb: 5 atomic %)

Electric power for sputter: DC power source 300 W

Pressure (when gas is introduced): 0.27 Pa

Introduced gas and flow rate: Ar=58.5 sccm

Then, on the metal film of Mo—Nb alloy which was formed as described above, a resist pattern for forming a first electrode was formed using a photo-resist AZ-5124E (trade name, manufactured by Clariant Japan). As the resist pattern, a straight line-shaped pattern having a line width of 5 μm was used.

Thereafter, wet etching of the metal film of Mo—Nb alloy was performed using ETCHANT FOR MO TSL (trade name) manufactured by Hayashi Pure Chemical Ind., Ltd. as an etchant for the wet etching (at a liquid temperature of 31° C.) and using the above formed resist pattern as a mask.

Note that, the above wet etching of the metal film of Mo—Nb alloy was performed at a liquid temperature of 31° C. In this process, the etching rate was 1.21 nm/sec.

Then, the resist pattern was removed using a resist remover solution AZ-REMOVER (trade name, manufactured by Clariant Japan). Thereby, a first electrode (a gate electrode), which was a patterned metal film of Mo—Nb alloy, was formed. The first electrode as a gate electrode was a straight line-shaped Mo—Nb pattern having a film thickness of 40 nm and a line width of 25 μm.

(Formation of Insulating Film)

Next, on the surface of the substrate at which the first electrode was formed, an $SiO_2$ film was formed to have a film thickness of 200 nm by sputtering under the conditions described below. The $SiO_2$ film was formed so as to cover almost the whole surface of the first electrode, however, a part of the surface (a terminal area for applying voltage) was not covered by sputtering using a shadow mask.

—Sputtering Conditions for Insulating Film—

Sputtering apparatus: RF (radio frequency) magnetron sputtering apparatus

Target: 3-inch diameter $SiO_2$ target, manufactured by Furuuchi Chemical Corporation (purity 4N)

Electric power for sputter: RF power source 200 W

Pressure (when gas is introduced): 0.164 Pa

Introduced gases and flow rates: Ar=40 sccm, $O_2$=4.5 sccm (Formation of Active Layer)

An active layer was formed on the insulating film. Using a polycrystalline sintered body having a composition of $InGaZnO_4$ (having a diameter of 3 inch) as a target, an active layer having a thickness of 50 nm was formed by sputtering under the following conditions.

—Sputtering Conditions for Active Layer—

Sputtering apparatus: RF magnetron sputtering apparatus

Electric power for sputter: RF power source 200 W

Pressure (when gas is introduced): 0.37 Pa

Introduced gases and flow rates: Ar=97 sccm, $O_2$=1.8 sccm (Formation of Second Electrode as Source Electrode and Drain Electrode)

On the active layer, an Mo metal film having a thickness of 50 nm was formed by a sputtering method. The sputtering conditions are described below.

—Sputtering Conditions for Mo Metal Film—
Sputtering apparatus: DC magnetron sputtering apparatus
Target: 3-inch diameter Mo target
Electric power for sputter: DC power source 300 W
Pressure (when gas is introduced): 0.27 Pa
Introduced gas and flow rate: Ar=58.5 sccm Next, a resist pattern for forming a source electrode and a drain electrode was formed on the formed Mo metal film using a photo-resist AZ-5124E (trade name, manufactured by Clariant Japan). Then, wet etching of the Mo metal film was performed using TSL (trade name) manufactured by Kanto Chemical Co., Inc. as an etchant for the wet etching (at a liquid temperature of 21° C.) and using the above formed resist pattern as a mask.

Then, the resist pattern was removed using a resist remover solution AZ-REMOVER (trade name, manufactured by Clariant Japan). Thereby, a second electrode (a source electrode and a drain electrode) which was a patterned Mo metal film was formed.

Thereby, electronic device 1 as a field-effect transistor was formed.

Example 2

Preparation of Electronic Device 2 as Field-Effect Transistor (Formation of First Electrode as Gate Electrode)

A PEN film (trade name: Q65FA, manufactured by DuPont Teijin Films) having a thickness of 150 μm was prepared as a substrate. On this substrate, a metal film which included an Mo—Nb alloy (Mo: 97 atomic %, Nb: 3 atomic %) and had a film thickness of 40 nm was formed by a sputtering method. The sputtering conditions are described below.

—Sputtering Conditions for Metal Film of Mo—Nb Alloy—
Sputtering apparatus: DC magnetron sputtering apparatus
Target: 4-inch diameter Mo—Nb alloy target (Mo: 97 atomic %, Nb: 3 atomic %)
Electric power for sputter: DC power source 300 W
Pressure (when gas is introduced): 0.27 Pa
Introduced gas and flow rate: Ar=58.5 sccm Then, the metal film of Mo—Nb alloy, which was prepared as described above, was subjected to processing through performing wet etching by substantially the same method and conditions as those in Example 1, thereby forming a first electrode. Further, an insulating film, an active layer, and a second electrode (a source electrode and a drain electrode) were formed in this order on the first electrode by substantially the same method and conditions as those in Example 1. Thereby, electronic device 2 as a field-effect transistor was prepared.

Comparative Example 1

Preparation of Comparative Electronic Device 1 as Field-Effect Transistor

Preparation of comparative electronic device 1 as a field-effect transistor was conducted by using a producing method and conditions substantially similar to those of the electronic device 1 prepared in Example 1, except that the first electrode (gate electrode) in the electronic device 1 prepared in the above Example 1 was changed to a first electrode (gate electrode) constituted from Mo alone in Comparative example 1.

In the comparative electronic device 1, a first electrode constituted from Mo alone was formed by the following method.

(Formation of First Electrode as Gate Electrode)

On a substrate which was used in Example 1 (a PEN film having a thickness of 150 μm (trade name: Q65FA, manufactured by DuPont Teijin Films)), a metal film which was constituted from Mo alone and had a film thickness of 40 nm was formed by a sputtering method. The sputtering conditions are described below.

—Sputtering Conditions for Mo Metal Film—
Sputtering apparatus: DC magnetron sputtering apparatus
Target: 4-inch diameter Mo target
Electric power for sputter: DC power source 300 W
Pressure (when gas is introduced): 0.27 Pa
Introduced gas and flow rate: Ar=58.5 sccm Then, on the Mo metal film which was formed as described above, a resist pattern for forming a first electrode was formed using a photo-resist AZ-5124E (trade name, manufactured by Clariant Japan). A straight line-shaped pattern having a line width of 200 μm was used as the resist pattern.

Thereafter, wet etching of the Mo metal film was performed using TSL (trade name) manufactured by Hayashi Pure Chemical Ind., Ltd. as an etchant for the wet etching (at a liquid temperature of 31° C.) and using the above formed resist pattern as a mask.

Note that, the above wet etching of the Mo metal film was performed at a liquid temperature of 31° C. In this process, the etching rate was 2.22 nm/sec, which was faster than the etching rate of the metal film of Mo—Nb alloy in Example 1.

Then, the resist pattern was removed using a resist remover solution AZ-REMOVER (trade name, manufactured by Clariant Japan). Thereby, a first electrode (a gate electrode) which was a patterned Mo metal film was formed. The first electrode as a gate electrode was a straight line-shaped Mo pattern having a film thickness of 40 nm and a line width of 25 μm. Further, as compared with the first electrode included the Mo—Nb alloy, which was formed in Example 1, reduction in wire width due to the etching was seen.

<Measurement and Evaluation>

With regard to the electronic device 1, the electronic device 2 and the comparative electronic device 1, which were obtained in the above Example and Comparative example, respectively, the following measurement and evaluation were performed. Results of the measurement and evaluation are shown in Table 1 described below.

<Measurement of Taper Angle of First Electrode>

The electronic device 1, the electronic device 2 and the comparative electronic device 1 obtained as described above were cut by a plane perpendicular to the substrate. Then, the cross section of the edge of the first electrode was photographed using a transmission electron microscope (TEM; magnification: 60,000 magnitudes).

Using the resulting TEM photographs, the taper angle of one edge cross section of the first electrode was measured. The obtained measurement results are shown in Table 1.

Here, the taper angle is an angle formed by a straight line, which corresponds to the contact face of the first electrode with the substrate, and another straight line, which connects the upper edge and the lower edge of the first electrode. The "upper edge" and "lower edge" are defined in the above description, so explanation thereof is omitted.

<Measurement of Surface Roughness Ra of First Electrode>

With regard to the electronic device 1, the electronic device 2, and the comparative electronic device 1, the surface roughness Ra of the upper face (the face opposed to the contact face of the first electrode with the substrate, hereinafter the same) of the first electrode was measured, before forming an insulating film on the patterned first electrode in the above production process. The obtained measurement results are shown in Table 1.

As shown in Table 1, the values of surface roughness Ra of the upper face of the first electrode in the electronic device 1 and the electronic device 2 were each equal to or less than half the value of surface roughness Ra of the upper face of the first electrode in the comparative electronic device 1. It is revealed that adhesion between the first electrode and the insulating film that is provided to be in contact with the upper face side of the first electrode can be improved, with regard to the first electrodes in the electronic device 1 and electronic device 2, as compared with the first electrode in the comparative electronic device 1.

Concerning the measurement of surface roughness Ra, with regard to the upper face of the first electrode that is formed in each of the above Example 1, Example 2 and Comparative example 1, the surface roughness Ra is an average of the values of surface roughness Ra obtained from three line profiles of a scanning distance of 1 µm in an AFM image on 1-micrometer square (measurement range of 1 µm×1 µm). Note that, the AFM image was obtained using an atomic force microscope (AFM, trade name: NANO-R, manufactured by Pacific Nanotechnology, Inc.).

<Evaluation of Adherence Force to Substrate>
(Measurement of Membrane Stress)

The membrane stresses of the first electrodes used in the electronic device 1 and comparative electronic device 1 were measured. The obtained measurement results are shown in Table 1.

As is clear from the measurement results shown in Table 1, the membrane stress of the first electrode in the electronic device 1 was smaller than the membrane stress of the first electrode in the comparative electronic device 1. Therefore, it is realized that it is more difficult to separate the first electrode from the substrate in the electronic device 1 and that the adhesion of the first electrode with respect to the substrate is higher in the electronic device 1, as compared with the first electrode in the comparative electronic device 1.

Note that, the "membrane stress" is calculated according to the method described below.

Specifically, the membrane stress of the first electrode used in the electronic device 1 was calculated through measurement according to the following method.

First, a curvature radius of an Si wafer substrate having a thickness of 150 µm was measured using FLX-2320-S (trade name), manufactured by Toho Technology Corporation, under an environment of 25° C. and 50% RH.

Next, on the Si wafer substrate, a metal film included the Mo—Nb alloy, that was the constituent material of the first electrode in the electronic device 1, was formed in accordance with a sputtering method. A curvature radius of the laminated body, in which the metal film included the Mo—Nb alloy was formed on the Si wafer substrate, was measured using FLX-2320-S (trade name), manufactured by Toho Technology Corporation, under an environment of 25° C. and 50% RH. The difference between the curvature radius of the Si wafer substrate and the curvature radius of the laminated body (the laminate body in which the metal film including the Mo—Nb alloy was formed on the Si wafer substrate) was calculated to give a value of membrane stress of the first electrode used in the electronic device 1.

With regard to the first electrode used in the comparative electronic device 1, measurement of membrane stress was performed in a similar manner. First, a curvature radius of an Si wafer substrate having a thickness of 150 µm, which was substantially the same substrate as the substrate used for the measurement of membrane stress of the first electrode used in the electronic device 1, was measured using FLX-2320-S (trade name), manufactured by Toho Technology Corporation, under an environment of 25° C. and 50% RH.

Then, on the Si wafer substrate, a metal film constituted from Mo alone, that is the constituent material of the first electrode in the comparative electronic device 1, was formed in accordance with a sputtering method. A curvature radius of the laminated body, in which the metal film constituted from Mo alone was formed on the Si wafer substrate, was measured using FLX-2320-S (trade name), manufactured by Toho Technology Corporation, under an environment of 25° C. and 50% RH. The difference between the curvature radius of the Si wafer substrate and the curvature radius of the laminated body (the laminated body in which the metal film constituted from Mo alone was formed on the Si wafer substrate) was calculated to give a value of membrane stress of the first electrode used in the comparative electronic device 1.

(Bending Test)

With regard to the electronic device 1 and the comparative electronic device 1, before forming an insulating film on a patterned first electrode in the above production process, the first electrodes formed on the substrates, respectively, were put to bending test.

The bending test was performed as follows. With regard to the laminated bodies which were in the state in which the first electrode was formed on the substrate, in the electronic device 1 and the comparative electronic device 1, (the specimens had a size of 10 mm×10 mm and a thickness of 50 nm), bending was repeated under the condition of the curvature radius of the substrate of from 1.5 cm to 2 cm. Every time the bending was performed, a resistivity after a lapse of 3 seconds from the application of voltage of 10 V was measured using a resistivity meter manufactured by Mitsubishi Chemical Corporation as a bending test machine. Thereby, a surface resistivity of the first electrode was measured. The relationship between the frequency of bending and the resistivity is shown in FIG. 10. Further, the evaluation results are shown in Table 1.

The measurement results of the bending test shown in FIG. 10 show that, when the plots (plots 80 represented by a square in FIG. 10), which show the bending test results of the laminated body that was in the state in which the first electrode was formed on the substrate in the electronic device 1, are compared with the plots (plots 82 represented by a diamond shape in FIG. 10) which show the bending test results of the laminated body that was in the state in which the first electrode was formed on the substrate in the comparative electronic device 1, the variation in resistivities of the first electrode in the electronic device 1 is smaller, even when the frequency of bending is increased.

Thus, similar to the above measurement results of the membrane stress, the measurement results of the bending test indicate that the adhesion between the first electrode and the substrate in the electronic device 1 is higher as compared with the adhesion between the first electrode and the substrate in the comparative electronic device 1.

<Evaluation of X-ray Diffraction>

With regard to each of the first electrodes formed in the electronic device 1, the electronic device 2, and the comparative electronic device 1, XRD (X-ray diffraction) was performed under the condition of a scan axis of 2 θ/w using an X-ray diffractometer (manufactured by Rigaku Corporation). As a result, line 50 shown in FIG. 9 was obtained as the analysis results of the XRD (X-ray diffraction) for the first electrode of the electronic device 1 prepared in Example 1 and the first electrode of the electronic device 2 prepared in Example 2. Further, line 52 shown in FIG. 9 was obtained as the analysis results of the XRD (X-ray diffraction) for the first electrode of the comparative electronic device 1 prepared in Comparative example 1.

As shown in FIG. 9, the peak obtained from the measurement results of X-ray diffraction of the first electrode in the electronic device 1 and the electronic device 2 was broader, as compared with the peak obtained from the measurement results of X-ray diffraction of the first electrode in the comparative electronic device 1. Thus, it is verified that the first electrodes in the electronic device 1 and the electronic device 2 were more amorphous, as compared with the first electrode in the comparative electronic device 1.

TABLE 1

| | First Electrode | | | Evaluation of Adherence Force to Substrate | |
|---|---|---|---|---|---|
| | Constituent Material | Taper Angle of Edge Cross Section (°) | Surface Roughness Ra (nm) | Membrane Stress (MPa) | Bending Test |
| Example 1 | Mo—Nb alloy | 37 | 0.3 | 544 | good |
| Example 2 | Mo—Nb alloy | 45 | 0.5 | — | — |
| Comparative Example 1 | Mo | 80 | 1.0 | 1422 | bad |

<Measurement of Leak Current>

The leak currents in the electronic device 1, electronic device 2, and comparative electronic device 1 obtained as described above were measured using a semiconductor parameter analyzer 4155C (trade name, manufactured by Agilent Technologies Inc.).

Here, the leak current is a current density value (A/cm$^2$) of a current that flows between the gate electrode and the source electrode, when voltage is applied between the gate electrode as the first electrode and the source electrode as the second electrode. As a result of the measurement, results shown by line 60 in FIG. 7 were obtained as the leak current characteristic (the line showing the relationship between the applied voltage and the leak current) of the electronic device 1 prepared in Example 1. Further, results shown by line 62 in FIG. 7 were obtained as the leak current characteristic (the line showing the relationship between the applied voltage and the leak current) of the electronic device 2 prepared in Example 2.

Figure 7:
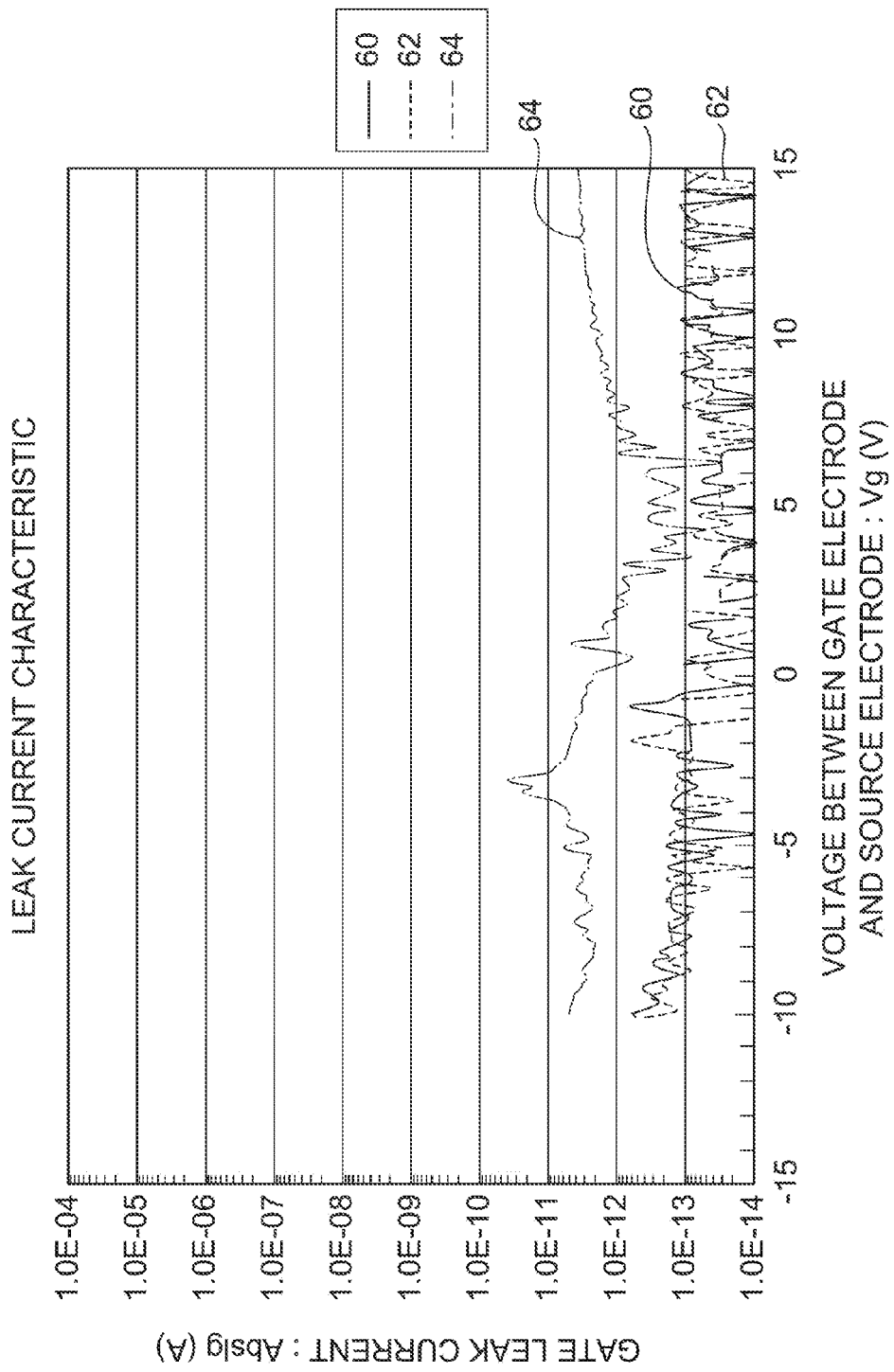
FIG. 7 is a diagram showing the measurement results of leak current characteristics in the example.

Further, results shown by line 64 in FIG. 7 were obtained as the leak current characteristic of the comparative electronic device 1 prepared in Comparative example 1. It is verified from the above results that, comparing the leak current characteristics of the electronic device 1 and the electronic device 2 (line 60 and line 62 in FIG. 7) with the leak current characteristic of the comparative electronic device 1 (line 64 in FIG. 7), the electronic device 1 and the electronic device 2 exhibited a great reduction in leak current.

<Evaluation of Transistor Characteristic>

With regard to the electronic device 1, electronic device 2, and comparative electronic device 1 obtained as described above, a current-voltage characteristic at the time of applying gate voltage was measured, through measuring a drain current when voltage was applied to the gate electrode as the first electrode using a semiconductor parameter analyzer (trade name: 4155C, manufactured by Agilent Technologies Inc.). As a result, results shown in FIG. 8 were obtained. In detail, results shown by line 70 in FIG. 8 were obtained as the current-voltage characteristic of the electronic device 1, results shown by line 72 in FIG. 8 were obtained as the current-voltage characteristic of the electronic device 2, and results shown by line 74 in FIG. 8 were obtained as the current-voltage characteristic of the comparative electronic device 1. It is revealed that in the electronic device 1 and the electronic device 2, as compared with the case in the comparative electronic device 1, good transistor characteristics with a high ON/OFF ratio [ON current/OFF current] were obtained.

Further, with regard to the electronic device 1, electronic device 2, and comparative electronic device 1 obtained as described above, a current value with which the field-effect transistor became an ON state was measured. As a result, the current value with which the field-effect transistor became an ON state was about +1 V in the electronic device 1 and the electronic device 2, and −2 V in the comparative electronic device 1. The results show that a good normally-on state is realized by using the Mo—Nb alloy for the gate electrode (fist electrode) as compared with the case of using Mo alone.

The invention includes the following exemplary embodiments.

(1) An electronic device comprising: a first electrode that is provided on a substrate and includes an Mo—Nb alloy; an insulating film disposed on the first electrode; and a second electrode disposed on the first electrode with at least the insulating film interposed between the first electrode and the second electrode.

(2) The electronic device according to the item (1), wherein a taper angle of an edge cross section of the first electrode is less than 50°.

(3) The electronic device according to the item (1), wherein a taper angle of an edge cross section of the first electrode is less than 40°.

(4) The electronic device according to any one of the items (1) to (3), wherein the electronic device is a field-effect transistor in which the first electrode is a gate electrode, the second electrode is a source electrode and a drain electrode, and an active layer having an oxide semiconductor as the principal constituent is provided between the source electrode and the drain electrode.

(5) The electronic device according to the item (4), wherein the oxide semiconductor comprises an amorphous oxide containing at least one selected from the group consisting of In, Zn, and Ga.

(6) The electronic device according to the item (1), wherein the Mo—Nb alloy is amorphous.

(7) The electronic device according to any one of the items (1) to (6), wherein a surface roughness Ra of the first electrode is 0.6 nm or less.

(8) The electronic device according to any one of the items (1) to (7), wherein a thickness of the first electrode is from 10 nm to 100 nm.

(9) The electronic device according to any one of the items (1) to (8), wherein the substrate has flexibility.
(10) The electronic device according to any one of the items (1) to (9), wherein a thickness of the substrate is from 50 μm to 500 μm.
(11) The electronic device according to any one of the items (1) to (10), wherein a film thickness of the insulating layer is from 10 nm to 1000 nm.
(12) A method for producing an electronic device, the method comprising: forming, on a substrate, a first electrode that includes an Mo—Nb alloy, by patterning a metal film that is formed on the substrate and includes the Mo—Nb alloy; forming an insulating film, that covers at least a part of the first electrode, in accordance with a sputtering method; and forming a second electrode so as to be disposed on the first electrode with at least the insulating film interposed between the first electrode and the second electrode.

All publications, patent applications, and technical standards mentioned in this specification are herein incorporated by reference to the same extent as if each individual publication, patent application, or technical standard was specifically and individually indicated to be incorporated by reference.

What is claimed is:

1. An electronic device comprising:
a first electrode that is provided on a substrate and includes an Mo—Nb alloy;
an insulating film disposed on the first electrode; and
a second electrode disposed on the first electrode with at least the insulating film interposed between the first electrode and the second electrode; wherein the electronic device is a field-effect transistor, in which:
the first electrode is a gate electrode;
the second electrode is a source electrode and a drain electrode; and
an active layer having an oxide semiconductor as the principal constituent is provided between the source electrode and the drain electrode; and wherein
the oxide semiconductor comprises an amorphous oxide containing at least one selected from the group consisting of In, Zn, and Ga.

2. The electronic device according to claim 1, wherein a taper angle of an edge cross section of the first electrode is less than 50°.

3. The electronic device according to claim 1, wherein a taper angle of an edge cross section of the first electrode is less than 40°.

4. The electronic device according to claim 1, wherein the Mo—Nb alloy is amorphous.

5. The electronic device according to claim 1, wherein a surface roughness Ra of the first electrode is 0.6 nm or less.

6. The electronic device according to claim 1, wherein a thickness of the first electrode is from 10 nm to 100 nm.

7. The electronic device according to claim 1, wherein the substrate has flexibility.

8. The electronic device according to claim 1, wherein a thickness of the substrate is from 50 μm to 500 μm.

9. The electronic device according to claim 1, wherein a film thickness of the insulating layer is from 10 nm to 1000 nm.

10. A method for producing an electronic device, the method comprising:
forming, on a substrate, a first electrode that includes an Mo—Nb alloy, by patterning a metal film that is formed on the substrate and includes the Mo—Nb alloy;
forming an insulating film, that covers at least a part of the first electrode, in accordance with a sputtering method; and
forming a second electrode so as to be disposed on the first electrode with at least the insulating film interposed between the first electrode and the second electrode;
wherein the electronic device is a field-effect transistor, in which:
the first electrode is a gate electrode;
the second electrode is a source electrode and a drain electrode; and
an active layer having an oxide semiconductor as the principal constituent is provided between the source electrode and the drain electrode; and wherein
the oxide semiconductor comprises an amorphous oxide containing at least one selected from the group consisting of In, Zn, and Ga.

* * * * *